United States Patent
Wang et al.

(10) Patent No.: US 6,437,436 B2
(45) Date of Patent: Aug. 20, 2002

(54) INTEGRATED CIRCUIT CHIP PACKAGE WITH TEST POINTS

(75) Inventors: Peter Wang, Basking Ridge, NJ (US); Yu-Wen Huang, Su-Lin (TW)

(73) Assignee: ANG Technologies Inc., Basking Ridge, NJ (US)

(*) Notice: Subject to any disclaimer, the term of this patent is extended or adjusted under 35 U.S.C. 154(b) by 0 days.

(21) Appl. No.: 09/766,081

(22) Filed: Jan. 19, 2001

Related U.S. Application Data

(60) Provisional application No. 60/177,129, filed on Jan. 20, 2000.

(51) Int. Cl.[7] ............................................. H01L 23/04
(52) U.S. Cl. ........................ 257/698; 257/48; 257/693
(58) Field of Search ........................ 257/48; 438/11, 438/14, 15, 18

(56) References Cited

U.S. PATENT DOCUMENTS

| | | | | |
|---|---|---|---|---|
| 5,018,005 A | * | 5/1991 | Lin et al. | 257/48 |
| 5,045,922 A | * | 9/1991 | Kodama et al. | 257/778 |
| 5,250,843 A | * | 10/1993 | Eichelberger | 257/692 |
| 5,564,617 A | | 10/1996 | Degani et al. | 228/6.2 |
| 5,807,763 A | * | 9/1998 | Motika et al. | 438/18 |
| 5,986,460 A | * | 11/1999 | Kawakami | 324/765 |
| 6,026,564 A | | 2/2000 | Wang et al. | 29/830 |
| 6,246,252 B1 | * | 6/2001 | Malladi et al. | 324/765 |
| 6,277,660 B1 | * | 8/2001 | Zakel et al. | 438/14 |
| 6,300,782 B1 | * | 10/2001 | Hembree et al. | 324/760 |
| 6,313,999 B1 | * | 11/2001 | Fratti et al. | 361/774 |

* cited by examiner

*Primary Examiner*—Jasmine J B Clark
(74) *Attorney, Agent, or Firm*—Cohen, Pontani, Lieberman & Pavane

(57) ABSTRACT

A flip-chip IC package configured for ease of testing comprises a substrate and a plurality of stiffener walls, each stiffener wall carrying an IC, wherein the stiffener walls and ICs are fixed to the substrate with electrical continuity being established between the substrate and the stiffener walls and IC's through conductive bumps (solder bumps or conductive epoxy bumps). The substrate and the stiffener walls include test points on their surfaces, and also include printed electrical circuitry connecting the test points and the conductive bumps. Some of the printed electrical circuitry is arranged to establish paths between test points which facilitate testing of conductivity through the conductive bumps, and which facilitate functional testing of the ICs.

8 Claims, 3 Drawing Sheets

INTEGRATED CIRCUIT CHIP PACKAGE WITH TEST POINTS

This application claims priority from Provisional application Ser. No. 60/177,129, filed Jan. 20, 2000.

BACKGROUND OF THE INVENTION

1. Field of the Invention

The present invention pertains to flip-chips, and particularly to a package for flip-chips and a method of making and testing the same.

2. Description of the Related Art

In recent years, new technologies which can provide high-density connections to and between integrated circuits within electronic equipment have emerged. These technologies include the assembling of multichip modules which may contain several unpackaged integrated circuit (IC) chips mounted on a single substrate.

Various techniques for assembling unpackaged IC chips in a multichip module are available. These modules may be assembled by, for example, using either wire bonded connections, tape-automatic-bonded (TAB) connections, or solder flip-chip bonding, depending on the desired number and spacing of signal input-output (I/O) connections on both the chip and the substrate as well as permissible cost.

In a comparison of these three techniques, wire bonding is the most common chip-bonding technique. This technique has traditionally provided the maximum number of chip connections with the lowest cost per connection. A disadvantage of wire bonding is that inductance present in the wires used in connecting the chip to the substrate degrades the electrical performance of the circuitry in the multichip module. Also, since the I/O connections are perimeter connections on the chip and since the wires connect to the substrate on an area not occupied by the chips, wire bonding requires more area on the substrate than that required in flip-chip bonding. Finally, wire bonding requires each connection between the chip and the substrate to be made one at a time and, therefore, is time consuming and therefore expensive to assemble.

TAB bonding permits higher density I/O connections over wire bonding. This technique, however, is more expensive than wire bonding. This is, in part, because TAB bonding requires special tooling for each different chip design. Also like wire bonding, TAB bonding similarly requires I/O perimeter connections and therefore more area on a substrate than flip-chip bonding. There is also undesirable parasitic inductance which imposes a penalty on electrical performance of the IC chip circuitry connected using this bonding technique.

Flip-chip bonding of a multichip module is achieved by providing an IC chip with either perimeter or area array solder-wettable metal pads which comprise the signal (I/O) terminals on the chip, and a matching footprint of solder-wettable pads on the substrate. Before assembly onto the substrate, either the chip, the substrate, or both typically undergo a processing step wherein a solid solder bump is deposited at each signal (I/O) terminal on an IC chip or on both an IC chip and a substrate. The chip is then turned upside down, or flipped, and placed in an aligned manner on top of a substrate such that the solder bumps align with the wettable metal pads, or such that a pair of solder bumps on the chip and the substrate align with each other. All connections are then made simultaneously by heating the solder bumps to a reflow temperature at which the solder flows and an electrically conductive joint between the contact pads on both the substrate and the IC chip is formed. Such a process is described by R. R. Tummala and E. J. Rymaszewski in *Microelectronics Packaging Handbook*, New York: Van Nostrand Reinhold, 1989, pp. 366–391.

Thus flip-chip bonding of IC chips used in multichip modules provides the advantage of requiring less area on a substrate and thereby facilitates high-density interconnections of the chips comprising the module. Since the interconnections are short, well controlled electrical characteristics are provided. High-speed signals are thus propagated in and through the module with minimum delay and distortion. Also since flip-chip bonding is a batch process, all interconnections are made quickly and simultaneously through a solder reflow step.

It is usually necessary to test IC units after manufacture; however, the high density of IC mounting enabled by flip-chip technology compounds the complexity of testing. There is a need to provide a simplified means for testing IC units fabricated by flip-chip methods, particularly for ensuring that the solder reflow has occurred uniformly over an entire unit.

SUMMARY OF THE INVENTION

The present invention provides a substrate and a plurality of stiffener walls, each stiffener wall carrying an IC, wherein the stiffener walls and ICs are fixed to the substrate with electrical continuity being established between the substrate and the stiffener walls and IC's through conductive bumps (solder bumps or conductive epoxy bumps). The substrate and the stiffener walls include test points on their surfaces, and also include printed wiring connecting at least the test points and the conductive bumps. Some of the printed wiring is arranged to establish paths between test points. Some of the paths between test points pass through portions of ICs. The test paths facilitate testing of conductivity through the conductive bumps, and functional testing of the ICs.

Thus, the invention provides simple and inexpensive means of testing dense and complex IC packages, including verification that the solder reflow process has been effected uniformly throughout the entire package.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF DRAWINGS

In the drawings, wherein like reference characters denote similar elements throughout the several views.

DESCRIPTION OF THE PRESENTLY PREFERRED EMBODIMENTS

Figure 1:
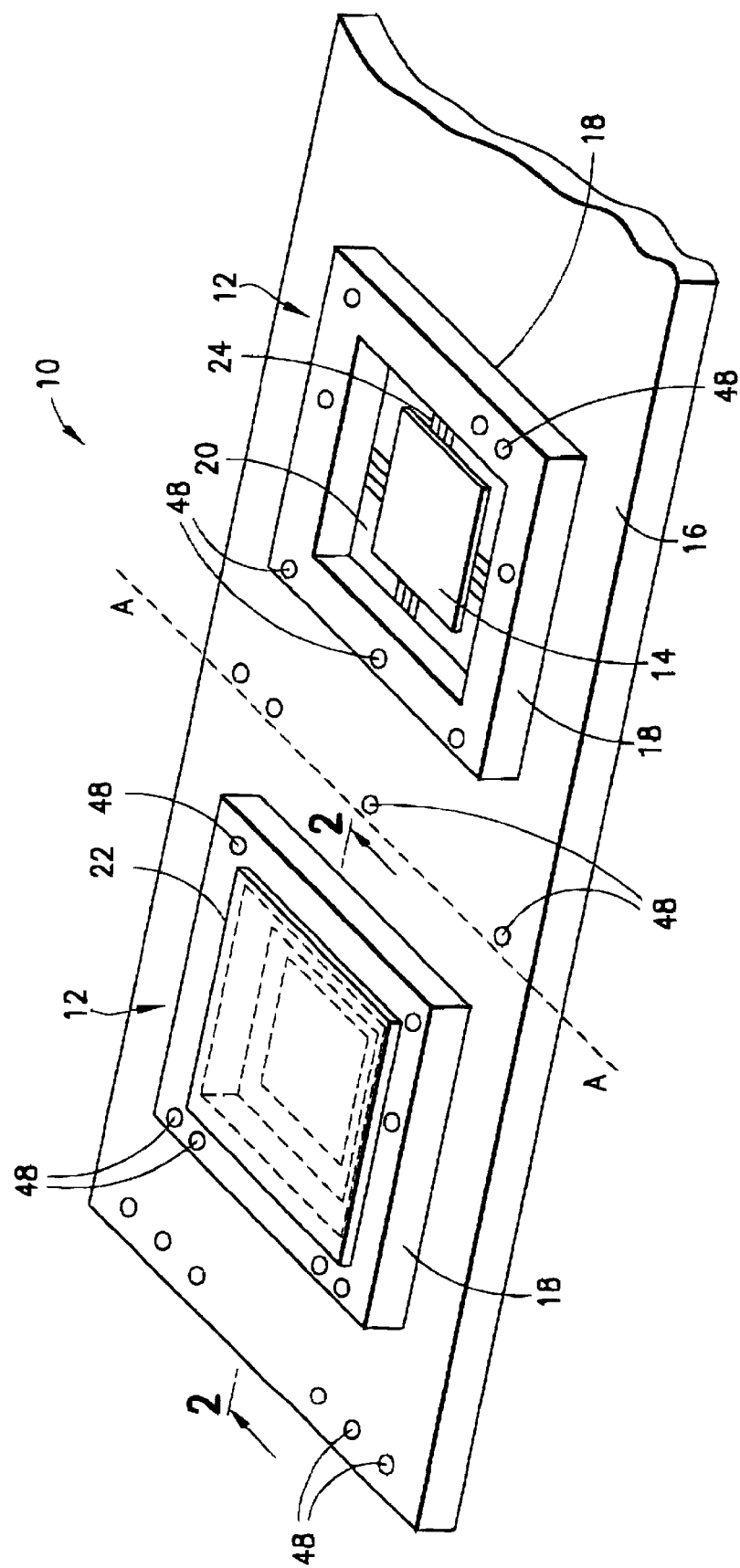
FIG. 1 illustrates an assembly of chip packages of the present invention.
Figure 2:
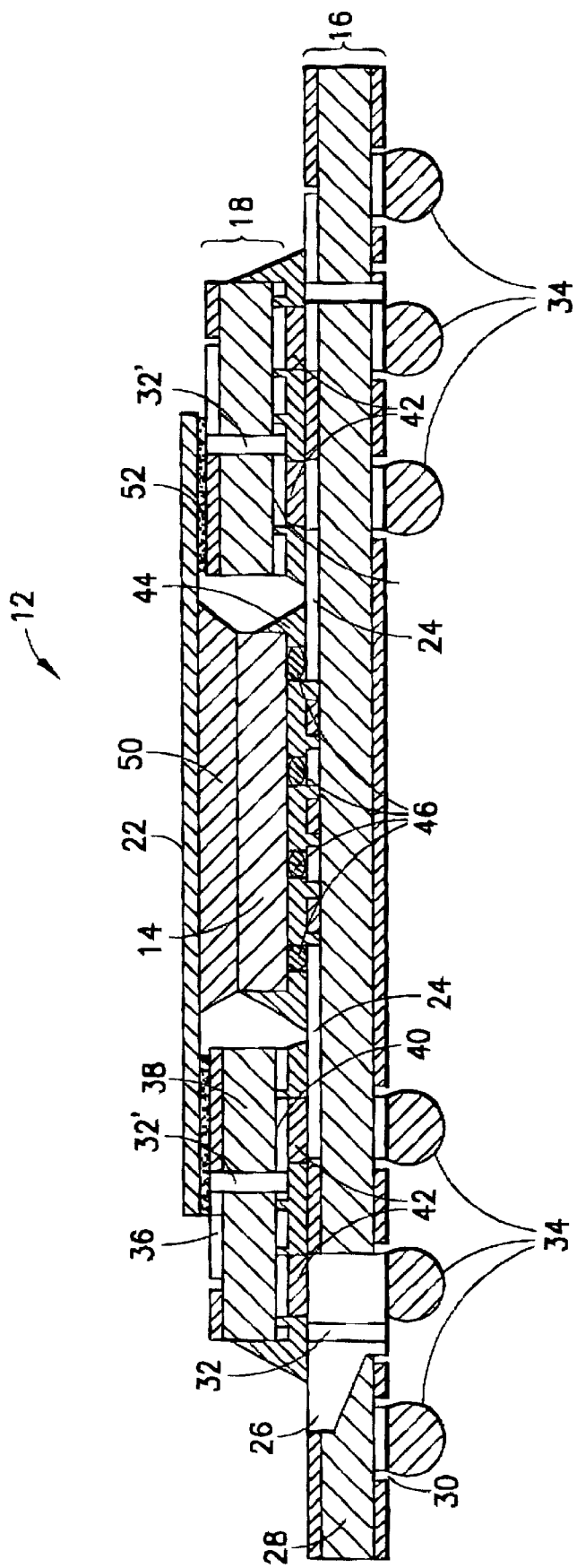
FIG. 2 is a sectional view of one of the chip packages of FIG. 1 along line 2—2.

FIGS. 1 and 2 illustrate an assembly 10 of two or more chip packages 12 constructed in accordance with an embodiment of the present invention. FIG. 2 is a sectional view of the chip package 12 along the line 2—2. Each chip package 12 includes a chip 14 (e.g., a flip-chip) mounted (preferably, solder-bumped) on a substrate 16, and a stiffener wall 18 disposed along and spaced from each lateral side of the chip 14, and surrounding the chip 14 such that a top opening 20 is formed above the chip 14. A heat-conductive plate 22, disposed above the chip 14, covers the top opening 20 formed by the stiffener wall 18. Heat-conductive plate 22 is secured in place preferably by adhesive 52, which is preferably also heat-conductive. An underfill material 44 may be provided in the chamber defined by the stiffener wall 18 and the heat conductive plate 22. Electrical test points 48 for conducting tests (e.g., continuity and/or performance) on the assembly 10 and/or each chip package 12 are provided on the substrate 16 and on the stiffener wall 18.

Preferably, the substrate 16 is shaped as a strip and the chips 14 are arranged in a line along a top surface of the strip. Alternatively, the substrate 16 may have an array of chip packages 12 arranged in a plurality of rows and columns. The substrate strip 16 may be formed as a multilayer structure comprising one or more dielectric layers formed of, for example, BT (produced by Mitsubishi), FR4, or ceramic. A conductive wiring pattern may be disposed between adjacent layers of the substrate strip if it is multilayered. Alternatively, a conductive wiring pattern or electric circuitry may be placed on an outer surface of the substrate 16. In that case, the circuitry pattern is preferably coated with an electrically insulating substance.

Similar to the substrate strip 16, the stiffener wall 18 may also be constructed as a multilayer structure. Wiring patterns formed in the stiffener wall 18 are electrically connected to the circuit patterns on the chip 14 through conductive lines 24, and to those wiring patterns formed in or on the substrate 16. In a particularly preferred embodiment, the substrate strip 16 and the stiffener wall 18 are formed using the methods described in U.S. Pat. No. 6,026,564, which is incorporated herein by reference.

After testing of the assembly (discussed below) is complete, the chip packages may be separated from each other by cutting the substrate strip between chip packages 12, such as along line A—A as shown in FIG. 1.

In FIG. 2, the substrate 16 has three layers: a top layer 26, an intermediate layer 28, and a bottom layer 30. This number of layers is an example of a design expedient. Other numbers of layers could be used. Wiring patterns (e.g., signal planes) may be formed on layers 26, 30 and connected to each other through conductive via 32. Solder bumps (or contacts) 34 (or conductive epoxy) may be formed on the bottom layer 30 for connecting with another substrate or board. The stiffener wall 18 also has three layers: a top layer 36, an intermediate layer 38, and a bottom layer 40. Like the substrate 16, wiring patterns or electric circuitry may be formed on layers 36, 40 of the stiffener wall 18 and connected through conductive via 32'. The stiffener wall 18 may be connected to the wiring patterns of the substrate 16 through, for example, solder bumps (or contacts) 42 or conductive epoxy. Conductive lines 24 are also formed on the substrate 16 for connecting wiring patterns of the stiffener wall 18 and those of the chip 14 in the chamber defined by the stiffener wall 18 and the heat conductive plate 22. Preferably, an underfill material 44 is applied to encapsulate the solder bumps 42 which connect the stiffener wall 18 to the substrate, and solder bumps 46 connect the chip 14 to the substrate 16. A thermal conductive compound 50 may also be applied between the heat conductive plate 22 and the chip 14 so as to enhance heat removal from the chip 14.

Figure 3:
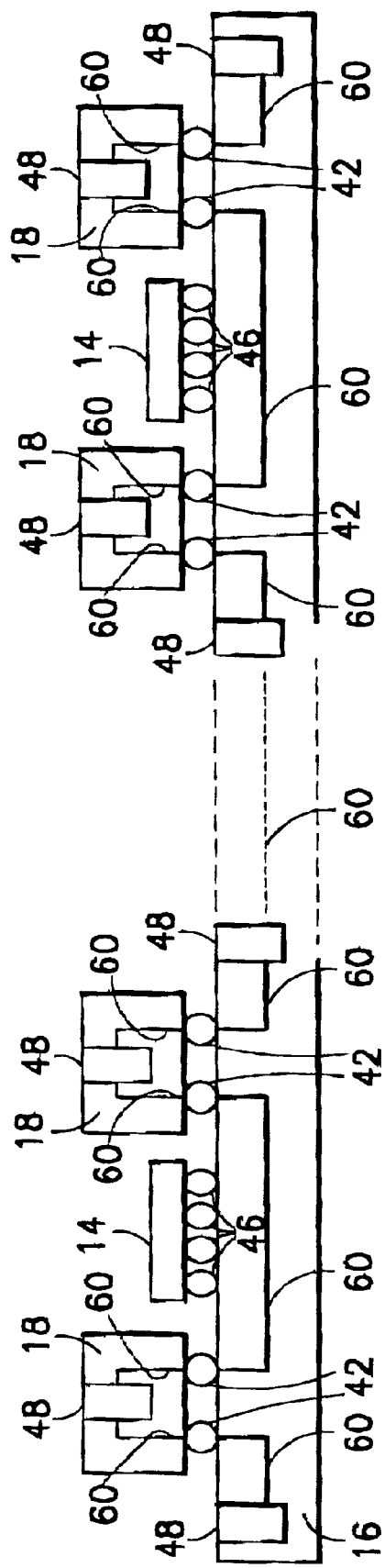
FIG. 3 is a schematic sectional view along the full length of a strip produced according to the present invention and showing a test path.

FIG. 3 is a schematic sectional view taken along the length of a substrate strip 16, with a plurality of chip packages 12 thereon. The first and last chip packages on the strip are shown explicitly; intermediate ones are suggested by dotted lines. As previously noted, substrate 16 and stiffener walls 18 each consist of three layers on which printed wiring may be placed. The printed wiring layers within substrate 16 may have interconnections as needed through vias 32, and those within stiffener walls 18 through vias 32' (as shown in FIG. 2). Through such printed wiring and vias there is formed an electrical path 60 from a test point 48 at one end of substrate strip 16, through solder bump connections and through both sides of each stiffener wall 18, to a test point 48 at the other end of substrate strip 16.

After fabrication of substrate strip 16, a continuity check is performed on the full length of electrical path 60. If the continuity check is successful, then all of the chip packages 12 and their connections are satisfactory. If the continuity check fails, then the solder reflow step was not uniformly effective along the full length of substrate strip 16. Although a failure of the continuity check indicates that at least one of the chip packages 12 is probably not functional, many of the chip packages 12 may be functional. The ones likely to be functional may be identified by performing continuity checks along selected portions of electrical path 60, portions being readily selectable according to choices of which of test points 48 to use in continuity testing.

Electrical paths other than the electrical path 60 may be designed into substrate strip 16 for performing other or more sophisticated tests than the continuity test facilitated by electrical path 60. For example, a path may be provided from a particular test point 48 to an input point on a chip 14, and from an associated output point on that chip 14 to another test point 48. A predetermined test signal may then be injected at the first test point 48, and an according response signal verified at the second test point 48. Absence of the according response signal indicates failure of the chip 14 or associated connections.

When the status of each chip package 12 has been determined, the chip packages are separated by cutting on line A—A as shown in FIG. 1. Defective or questionable chip packages 12 are then discarded.

Thus, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An integrated-circuit (IC) package for mounting an IC therein, comprising:

a platelike dielectric substrate having two outer surfaces and having a first electrical circuitry, the first electrical circuitry having portions electrically continuous with test points on an outer surface of the substrate and with conductive contacts on an outer surface of the substrate;

a plurality of platelike dielectric members each for mounting therein an IC having electrical contacts on a surface, each member having two outer surfaces and having a second electrical circuitry disposed on at least one outer surface, the second electrical circuitry having portions electrically continuous with test points on a first outer surface of the member and with conductive contacts on a second outer surface of the member, the members being fixed to the substrate so that conductive contacts on the members are electrically continuous with conductive contacts on the substrate in a predetermined arrangement, the conductive contacts being positioned to be connectable to the electrical contacts of the IC upon mounting of the IC in the dielectric member.

2. The IC package of claim 1, wherein portions of the first electric circuitry and portions of the second electric circuitry are arranged so that after the members are fixed to the substrate a predetermined electrical path exists from a test point on the substrate through the first electrical circuitry and each second electrical circuitry to another test point on the substrate.

3. The IC package of claim 2, wherein; when an IC is mounted in the platelike dielectric member, each conductive contact is electrically continuous with a point within the IC;

the conductive contacts on each mounted IC become electrically continuous with conductive contacts on the substrate in a predetermined arrangement; and portions of the first electrical circuitry and portions of the second electrical circuitry are arranged so that after the conductive contacts on each mounted IC become electrically continuous with conductive contacts on the substrate, at least one predetermined electrical path exists from a first test point through a portion of an IC to a second test point, whereby application of a predetermined electrical signal to the first test point produces a determinate electrical response at the second test point when the mounted IC is functional and the conductive contacts have become continuous, and whereby deviation from said determinate response is indicative of defects in the IC package.

4. The IC package of claim 1, wherein the conductive contacts comprise conductive epoxy.

5. The IC package of claim 1, wherein the conductive contacts are solder bumps.

6. The IC package of claim 5, wherein the platelike members are fixed to the substrate by at least a solder reflow process.

7. An integrated-circuit (IC) package configured for ease of testing, comprising:

a substrate including one or more test points and conductive contacts on an outer surface of said substrate and a first electrical circuitry, the first electrical circuitry being electrically continuous with the test points and the conductive contacts;

a dielectric member disposed on said substrate and configured for housing an IC, said dielectric member including a second electrical circuitry, the second electrical circuitry being electrically continuous with the first electrical circuitry of said substrate through the conductive contacts of said substrate and said dielectric member so that upon connecting an IC to the substrate, the one or more test points of said substrate are in electrical communication with the IC housed by said dielectric member.

8. An integrated-circuit (IC) package configured for ease of testing, comprising:

a substrate including conductive contacts on an outer surface of said substrate and a first electrical circuitry, the first electrical circuitry being electrically continuous with the conductive contacts;

a dielectric member disposed on said substrate and configured for housing an IC, said dielectric member including one or more test points and a second electrical circuitry, the second electrical circuitry being electrically continuous with the first electrical circuitry of said substrate through the conductive contacts of said substrate and said dielectric member so that upon connecting an IC to the substrate, the one or more test points of said dielectric member are in electrical communication with the IC housed by said dielectric member.

* * * * *